(12) United States Patent
Ho et al.

(10) Patent No.: US 6,261,954 B1
(45) Date of Patent: Jul. 17, 2001

(54) METHOD TO DEPOSIT A COPPER LAYER

(75) Inventors: Paul Kwok Keung Ho; Subhash Gupta; Mei Sheng Zhou; Simon Chooi, all of Singapore (SG)

(73) Assignee: Chartered Semiconductor Manufacturing, Ltd., Singapore (SG)

( * ) Notice: Subject to any disclaimer, the term of this patent is extended or adjusted under 35 U.S.C. 154(b) by 0 days.

(21) Appl. No.: 09/501,968

(22) Filed: Feb. 10, 2000

(51) Int. Cl.$^7$ .................................................. H01L 21/44
(52) U.S. Cl. ........................................... 438/687; 438/633
(58) Field of Search ..................... 438/633, 643, 438/653, 677, 687, 629, 305, 304

(56) References Cited

U.S. PATENT DOCUMENTS

| | | |
|---|---|---|
| 5,354,712 | 10/1994 | Ho et al. . |
| 5,376,248 | 12/1994 | Conrod et al. ..................... 204/164 |
| 5,654,245 * | 8/1997 | Allen ..................... 438/629 |
| 5,674,787 | 10/1997 | Zhao et al. . |
| 5,918,150 * | 6/1999 | Nguyen et al. ..................... 438/687 |

OTHER PUBLICATIONS

I. V. Nelson etal. , J. Inorg. Nucl. Chem.. 1961, vol. 22. pp 279–284, Polarrographic Evidence For The Stability Of Copper (I) Iohn In Some Non–Complexing Nonaqueus Solvents.*

I.V. Nelson et al., "Polarographic Evidence for the Stability of Copper (I) Ionin some Non–Complexing Non–Aqueous Solvents", The Journal of Inorganic Nuclear Chemistry, vol. 22, 1961, pp. 279–284.

* cited by examiner

*Primary Examiner*—David Nelms
*Assistant Examiner*—Dung A Le
(74) *Attorney, Agent, or Firm*—George O. Saile; Rosemary L. S. Pike

(57) ABSTRACT

A new method of depositing a copper layer, using disproportionation of Cu(I) ions from a solution stabilized by a polar organic solvent, for single and dual damascene interconnects in the manufacture of an integrated circuit device has been achieved. A dielectric layer, which may comprise a stack of dielectric material, is provided overlying a semiconductor substrate. The dielectric layer is patterned to form vias and trenches for planned dual damascene interconnects. A barrier layer is deposited overlying the dielectric layer to line the vias and trenches. A simple Cu(I) ion solution, stabilized by a polar organic solvent, is coated overlying said barrier layer. Water is added to the stabilized simple Cu(I) ion solution to cause disproportionation of the simple Cu(I) ion from the Cu(I) ion solution. A copper layer is deposited overlying the barrier layer. The copper layer may comprise a thin seed layer for use in subsequent electroplating or electroless plating of copper or may comprise a thick copper layer to fill the vias and trenches. The integrated circuit is completed.

17 Claims, 4 Drawing Sheets

METHOD TO DEPOSIT A COPPER LAYER

RELATED PATENT APPLICATION

U.S. patent application Ser. No. 09/501,966 (CS-99-158) to H. K. K. Paul et al.

BACKGROUND OF THE INVENTION

(1). Field of the Invention

The invention relates to a method of fabricating semiconductor structures, and more particularly, to a method of depositing a copper layer in the manufacture of integrated circuit devices.

(2). Description of the Prior Art

Several approaches are currently available for depositing copper in integrated circuit manufacturing. First, the copper may be deposited by physical vapor deposition (PVD). PVD, or ionized PVD, processes benefit from available technology and relatively high throughput. However, PVD deposited copper has poor step coverage. Second, chemical vapor deposition (CVD) offers better step coverage than PVD. However, CVD is not yet a mature process and is expensive to use.

Third, electroplating and electroless plating of copper are attractive alternatives to PVD and CVD because of lower equipment and material costs. However, plating methods require the presence of a seed layer to conduct or to catalyze the deposition reaction. This seed layer typically comprises copper, though other materials such as refractory metals have been suggested. When this seed layer is copper, it is typically deposited by a PVD process. In addition, electroless plating may require an induction layer as a catalytic surface. Alternatively, copper may be plated by the reduction of $Cu^{2+}$ by a reducing agent such as aldehyde and hypophosphite. Finally, plating processes can be very slow and dirty.

The purpose of the present invention is to achieve a new method for depositing a copper layer in the manufacture of an integrated circuit device. The new method is simpler, cleaner, and cheaper than the existing methods.

Several prior art approaches disclose methods to deposit copper layers in an integrated circuit device and related topics. In I. V. Nelson et al, "Polarographic Evidence for the Stability of Copper (I) Ion in some Non-Complexing Non-Aqueous Solvents," *The Journal of Inorganic Nuclear Chemistry*, Volume 22, 1961, pp. 279–284, the stability of the cuprous ion (Cu+or Cu(I)) is studied. Cu(I) ion appears more stable in solvents such as methanol, ethanol, 1-propanol, 2-propanol, allyl alcohol, acetone, mesityl oxide, acetylacetone, acetic anhydride, nitromethane, and pyridine. This stability is actually due to lower salvation energy of cupric ($Cu^{2+}$ or Cu(II)) ion in these solvents and not due to higher salvation energy of Cu(I). U.S. Pat. No. 5,354,712 to Ho et al discloses a method to deposit copper for integrated circuit metalization. The copper layer is deposited by an organo-metallic chemical vapor deposition (OM-CVD) on a seed layer of titanium nitride. U.S. Pat. No. 5,376,248 to Conrod et al teaches an electrolytic process for plating a conductive material onto a plastic circuit board. A copper plating processing example is given where an aqueous solution of $Cu^{2+}$ is disproportionated to plate copper. U.S. Pat. No. 5,674,787 to Zhao et al teaches a method to selectively deposit copper by electroless plating. A titanium nitride barrier layer is formed. A silicon nitride layer is deposited on the sidewalls of the dual damascene trenches. Copper atoms are electroless plated overlying the titanium nitride barrier layer by a conventional plating solution. A copper layer is then electroless plated to fill the trench and the damascene device is completed. U.S. patent application Ser. No. 09/501,966 (CS-99-158) to H. K. K. Paul et al teaches a method of reacting $CuF_2$ vapor with a barrier layer to form a thin and conformal Cu seed layer.

SUMMARY OF THE INVENTION

A principal object of the present invention is to provide an effective and very manufacturable method of depositing a copper layer in the manufacture of integrated circuits.

A further object of the present invention is to provide a method to deposit a copper layer using disproportionation of simple Cu(I) ions from a solution stabilized by a polar organic solvent.

A yet further object of the present invention is to provide a method to deposit a copper seed layer, using disproportionation of simple Cu(I) ions from a solution stabilized by a polar organic solvent, for use in subsequent electroplating and electroless copper plating of single and dual damascene interconnects.

Another further object of the present invention is to provide a method to deposit a copper layer, using disproportionation of simple Cu(I) ions from a solution stabilized by a polar organic solvent, for single and dual damascene interconnects.

In accordance with the objects of this invention, a new method of depositing a copper layer, using disproportionation of simple Cu(I) ions from a solution stabilized by a polar organic solvent, for forming single and dual damascene interconnects in the manufacture of an integrated circuit. device has been achieved. A dielectric layer, which may comprise a stack of dielectric material, is provided overlying a semiconductor substrate. The dielectric layer is patterned to form vias and trenches for planned damascene interconnects. The damascene interconnects may be either single or dual damascene. A barrier layer is deposited overlying the dielectric layer to line the vias and trenches. A simple Cu(I) ion aqueous solution, stabilized by a polar organic solvent, is coated overlying the barrier layer. Water is added to the stabilized Cu(I) ion solution to induce disproportionation of the Cu(I) ion from the Cu(I) ion solution. Optionally, the polar organic solvent is evaporated from the stabilized Cu(I) ion aqueous solution to induce disproportionation of the Cu(I) ion from the Cu(I) ion solution. A copper layer is deposited overlying the barrier layer. The copper layer may comprise a thin seed layer for use in subsequent electroplating or electroless plating or may comprise a thick copper layer to fill the vias and trenches. The integrated circuit is completed.

BRIEF DESCRIPTION OF THE DRAWINGS

In the accompanying drawings forming a material part of this description, there is shown.

DESCRIPTION OF THE PREFERRED EMBODIMENTS

The embodiment discloses the application of the present invention to the formation of damascene interconnects in the manufacture of an integrated circuit device. It should be clear to those experienced in the art that the present invention can be applied and extended without deviating from the scope of the present invention.

Figure 1:
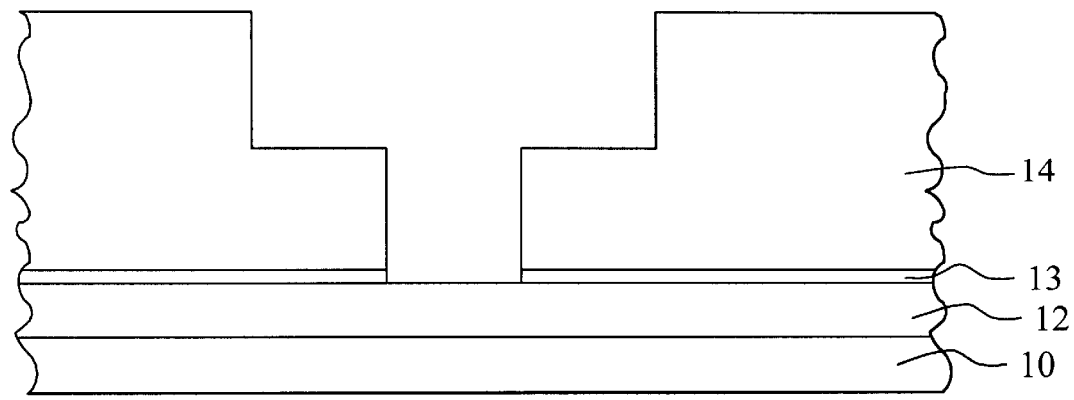
FIGS. 1 through 6 schematically illustrate in cross-sectional representation the preferred embodiment of the present invention applied to the formation of a dual damascene interconnect.

Referring now particularly to FIG. 1, there is shown a cross section of a partially completed integrated circuit device of the preferred embodiment. A semiconductor substrate 10, typically consisting of monocrystalline silicon, is provided. Semiconductor device structures, such as gate electrodes, source and drain regions, metal interconnects, contact holes and vias, not shown, may be formed in and on the semiconductor substrate 10. A conductor layer 12, typically copper or an interconnect stack comprising one or more of aluminum-copper, titanium nitride, titanium and tungsten, is deposited overlying the substrate 10. A passivation layer 13, typically silicon nitride, is deposited overlying the conductor layer 12. A dielectric layer 14 is deposited overlying the semiconductor substrate 10. The dielectric layer 14 is shown as a single layer for purposes of simplification. In practice, the dielectric layer 14 comprises a stack or composite of dielectric material. Typically, silicon dioxide based materials and low dielectric constant organic polymers would be used as the interlevel dielectric material. Silicon nitride would typically be used as an etching stop layer or as a polishing stop layer in the composite stack. The dielectric layer 14 is etched to form vias and trenches for planned dual damascene interconnects. The via opens to the conductor layer 12. The typical dual damascene profile is seen in FIG. 1.

Figure 2:
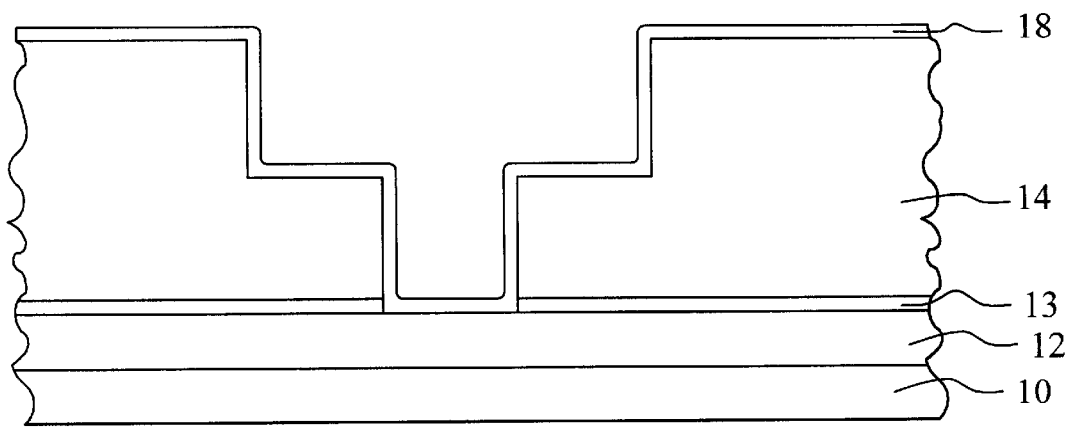

Referring now to FIG. 2, a barrier layer 18 is deposited overlying the dielectric layer 14 and the exposed conductor layer 12 and lining the vias and trenches. The barrier layer 18 is typically comprised of a material that will eliminate out-diffusion of copper ions from the dual damascene interconnect into the dielectric layer 14. The barrier layer 18 preferably comprises one of the group containing: tantalum, tantalum compounds, titanium, titanium compounds, tungsten and tungsten compounds. The barrier layer 18 is deposited using a physical vapor deposition (PVD) or chemical vapor deposition (CVD) process to a thickness of between about 50 Angstroms and 1000 Angstroms.

Figure 3:
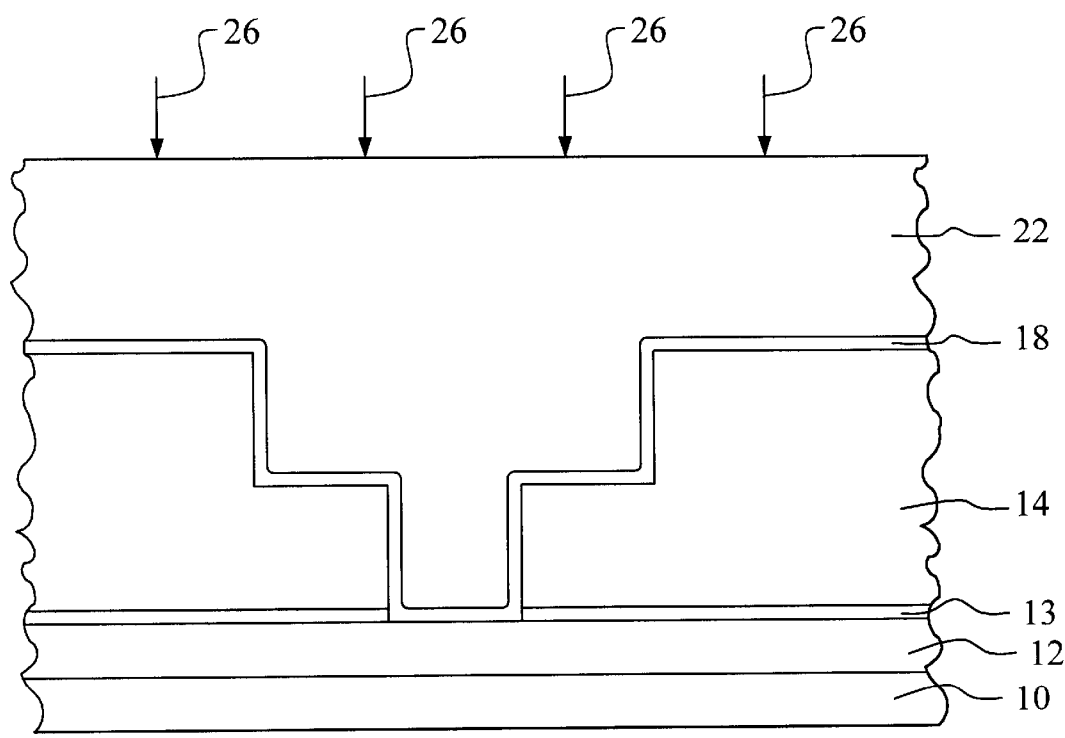

Referring now to FIG. 3, an important feature of the present invention is described. The present invention utilizes the disproportionation of simple Cu(I) to deposit a copper layer on the wafer via one of the following reactions:

(1) $Cu^+_{(organic\ solvent)} \rightleftharpoons Cu^{2+}_{(organic\ solvent)} + Cu_{(metal)}$ (2) $Cu^+_{(aqueous)} \rightleftharpoons Cu^{2+}_{(aqueous)} + Cu_{(aqueous)}$

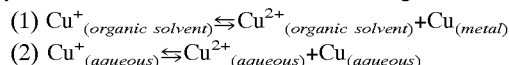

Simple Cu(I) ion disproportionates quickly and spontaneously into Cu(II) and Cu metal in an aqueous solution. This means that the normal reaction is overwhelmingly in the forward direction to the formation of Cu(II) and Cu. The instability of simple Cu(I) ions in aqueous solution is due to the higher hydration energy of Cu(II) ions. However, the hydration energy of Cu(II) ions decreases dramatically in many polar organic solvents while the hydration energy of Cu(I) ions stays relatively constant in these solvents. In addition, the hydration energy of Cu(II) ions increases progressively with the increase in proportion or amount of water in the polar organic solvent while the hydration energy of Cu(I) ions remains relatively constant.

The process of the present invention uses these observations to create a stabilized simple Cu(I) ion solution that can be spun onto the wafer. The stabilized Cu(I) ion solution comprises a mixture of Cu(I) ion and either: a polar organic solvent, a mixture of polar organic solvents, or a mixture of water and one or more of the polar organic solvents of any proportion. The polar organic solvent preferably comprises one of the group containing: 1-propanol, 2-propanol, allyl alcohol, acetone, mesityl oxide, acetic anhydride, pyridine, acetonitrile, and nitromethane.

The stabilized Cu(I) ion solution 22 is spun over the wafer especially overlying the barrier layer 18. Water 26 is then added to the stabilized Cu(I) ion solution 22 to induce disproportionation. The hydration energy of Cu(II) ion is increased so that the reaction proceeds to disproportionate Cu(I) ion into Cu(II) ion and solid copper. As an option, the wafer may be heated to induce evaporation of the polar organic solvent. As another option, the pressure around the wafer can be reduced to cause evaporation of the polar organic solvent. Evaporation increases the disproportionation reaction to deposit copper.

Figure 4:
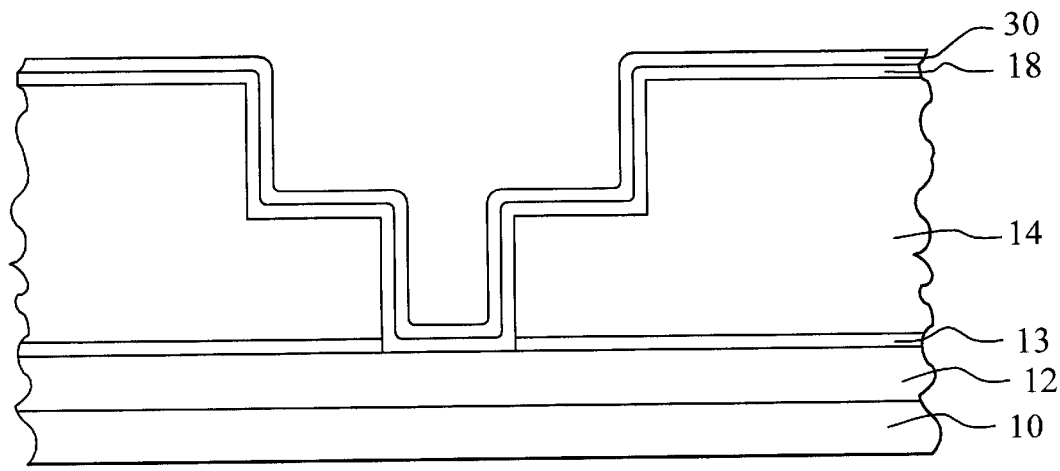

Referring now to FIG. 4, the reaction may be used to deposit a thin copper seed layer 30 overlying the barrier layer 18 for subsequent electroplating or electroless plating of a thick copper layer. The copper seed layer 30 is deposited to a thickness of between about 50 Angstroms and 2000 Angstroms.

Figure 5:
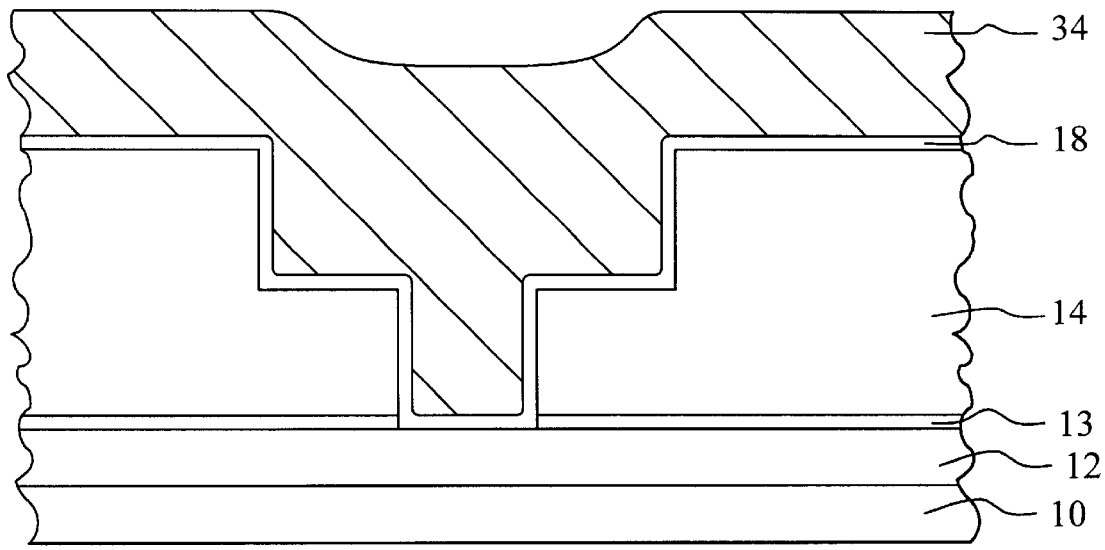

Referring now to FIG. 5, the result of the electroplating or electroless copper plating reaction is the deposition of a thick copper layer 34 overlying the barrier layer 18 and filling the vias and trenches. The thin copper seed layer 30 deposited by the disproportionation reaction is used as a seed to catalyze the plating reaction.

Alternatively, the disproportionation reaction shown in FIG. 3 could be continued to deposit a thick copper layer 34 overlying the barrier layer 18 and filling the vias and trenches as shown in FIG. 5. The use of the disproportionation reaction for copper bulk filling of the dual damascene vias and trenches creates an excellent copper layer. In this option, it is not necessary to electroplate or electroless plate the copper. The thick copper layer 34 deposited by the disproportionation reaction is deposited to a thickness of between about 3000 Angstroms and 20,000 Angstroms.

Figure 6:
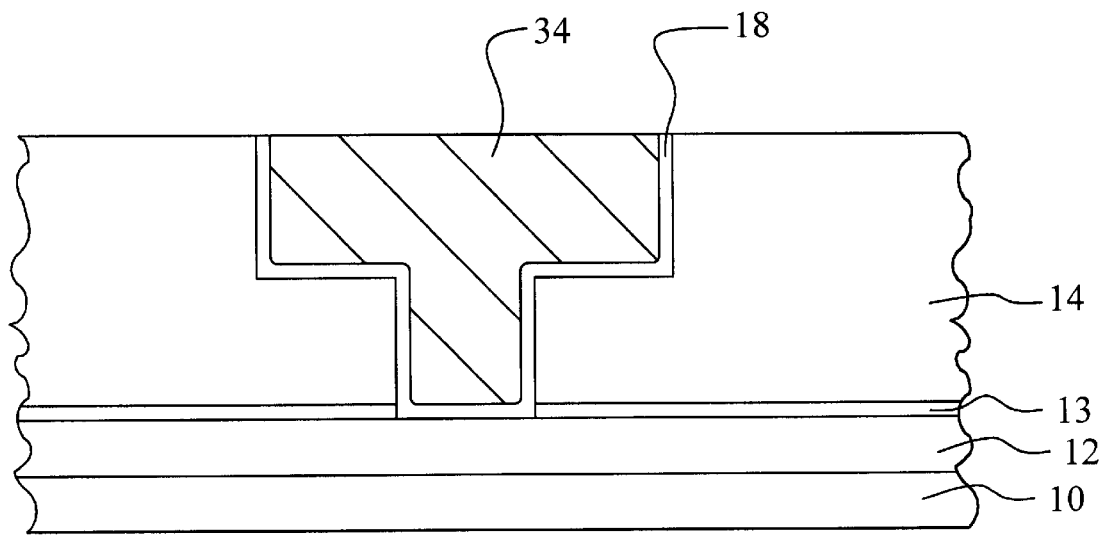

Referring now to FIG. 6, the copper layer 34 and the barrier layer 18 are polished down to complete the dual damascene interconnects. The copper layer 34 is now subjected to annealing in a furnace or a rapid thermal annealing (RTA) at a temperature of between about 80 degrees C. and 450 degrees C. A conventional chemical mechanical polish is used in the polishing down step. The integrated circuit is completed using conventional processes.

Figure 7:
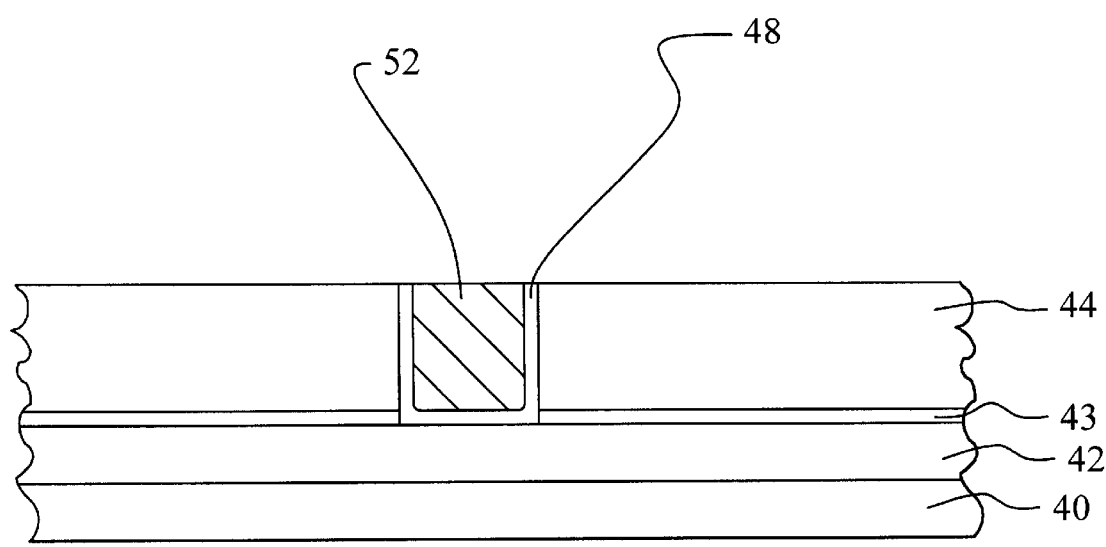
FIG. 7 schematically illustrates in cross-sectional representation the preferred embodiment of the present invention applied to the formation of a single damascene interconnect.

Referring now to FIG. 7, the preferred embodiment of the present invention is applied to the formation of a single damascene inlay. The conductor layer 42 overlies the semiconductor substrate 40. The passivation layer 43 overlies the conductor layer 42. The dielectric layer 44 overlies the passivation layer 43. A single damascene trench is etched through the dielectric layer 44 and the passivation layer 43 to open the underlying conductor layer 42. A barrier layer 48 of thickness between about 50 Angstroms and 1000 Angstroms is deposited overlying the dielectric layer 44 and the exposed conductor layer 42. It is understood by those skilled in the art that the aforementioned copper deposition by disproportionation of simple Cu(I) used in the formation of the dual damascene interconnects is also applicable to the single damascene interconnect 52.

Now the specific advantages of the present invention compared to the prior art can be Listed. The present invention deposits a copper layer by disproportionation of simple Cu(I) ions in a polar organic solvent. First, the novel process deposits the copper layer without the use of an expensive precursor, as in the case of CVD. Second, the process deposits the copper layer with better step coverage than the PVD process. Finally, the process can be used to deposit either a seed layer for subsequent electroless copper plating or to deposit a thick copper layer for damascene interconnects.

As shown in the preferred embodiments, the present invention provides a very manufacturable process for depositing a copper layer in an integrated circuit device.

While the invention has been particularly shown and described with reference to the preferred embodiments thereof, it will be understood by those skilled in the art that various changes in form and details may be made without departing from the spirit and scope of the invention.

What is claimed is:

1. A method to deposit a copper layer in the manufacture of an integrated circuit device comprising:

providing a dielectric layer overlying a semiconductor substrate;

depositing a barrier layer overlying said dielectric layer;

coating a stabilized simple Cu(I) ion solution overlying said barrier layer wherein said stabilized simple Cu(I) ion solution is stabilized by mixing with a polar organic solvent;

adding water to said stabilized simple Cu(I) ion solution to induce disproportionation of said simple Cu(I) ions from said stabilized simple Cu(I) solution; and depositing a copper layer overlying said barrier layer wherein said copper layer comes from said disproportionation of said simple Cu(I) ions in the manufacture of the integrated circuit device.

2. The method according to claim 1 wherein said barrier layer comprises one of the group containing: tantalum, tantalum compounds, titanium, titanium compounds, tungsten and tungsten compounds.

3. The method according to claim 1 wherein said stabilized simple Cu(I) ion solution comprises a mixture of simple Cu(I) ions and one of the group containing: a polar organic solvent, more than one polar organic solvent, a mixture of water and a polar organic solvent, and a mixture of water and more than one polar organic solvent.

4. The method according to claim 1 wherein said polar organic solvent comprises one of the group containing: 1-propanol, 2-propanol, allyl alcohol, acetone, mesityl oxide, acetic anhydride, pyridine, acetonitrile, and nitromethane.

5. The method according to claim 1 further comprising heating to evaporate said polar organic solvent from said stabilized simple Cu(I) ion solution to speed said depositing of said copper layer.

6. The method according to claim 1 further comprising reducing the pressure of said integrated circuit device to evaporate said polar organic solvent from said stabilized simple Cu(I) ion solution to speed said depositing of said copper layer.

7. The method according to claim 1 wherein said step of depositing said copper layer comprises:

depositing a copper seed layer wherein said copper seed layer comes from said disproportionation of said simple Cu(I) ions; and plating said copper seed layer to complete said depositing of said copper layer.

8. A method to deposit a copper layer in the manufacture of an integrated circuit device comprising:

providing a dielectric layer overlying a semiconductor substrate;

depositing a barrier layer overlying said dielectric layer;

coating a stabilized simple Cu(I) ion solution overlying said barrier layer wherein said stabilized simple Cu(I) ion solution is stabilized by mixing with a polar organic solvent;

adding water to said stabilized simple Cu(I) ion solution to induce disproportionation of said simple Cu(I) ions from said stabilized simple Cu(I) solution;

heating to induce evaporation of said polar organic solvent from said stabilized simple Cu(I) ion solution; and depositing a copper layer overlying said barrier layer wherein said copper layer comes from said disproportionation of said simple Cu(I) ions and wherein said evaporation speeds said depositing in the manufacture of said integrated circuit device.

9. The method according to claim 8 wherein said barrier layer comprises one of the group containing: tantalum, tantalum compounds, titanium, titanium compounds, tungsten and tungsten compounds.

10. The method according to claim 8 wherein said stabilized simple Cu(I) ion solution comprises a mixture of simple Cu(I) ions and one of the group containing: a polar organic solvent, more than one polar organic solvent, a mixture of water and a polar organic solvent, and a mixture of water and more than one polar organic solvent.

11. The method according to claim 8 wherein said polar organic solvent comprises one of the group containing: 1-propanol, 2-propanol, allyl alcohol, acetone, mesityl oxide, acetic anhydride, pyridine, acetonitrile, and nitromethane.

12. The method according to claim 8 wherein said step of depositing said copper layer comprises:

depositing a copper seed layer wherein said copper seed layer comes from said disproportionation of said simple Cu(I) ions; and plating said copper seed layer to complete said depositing of said copper layer.

13. A method to deposit a copper layer in the manufacture of an integrated circuit device comprising:

providing a dielectric layer overlying a semiconductor substrate;

depositing a barrier layer overlying said dielectric layer;

coating a stabilized simple Cu(I) ion solution overlying said barrier layer wherein said stabilized simple Cu(I) ion solution is stabilized by mixing with a polar organic solvent;

adding water to said stabilized simple Cu(I) ion solution to induce disproportionation of said simple Cu(I) ions from said stabilized simple Cu(I) solution;

reducing the pressure on said integrated circuit device thereby inducing evaporation of said polar organic solvent from said stabilized simple Cu(I) ion solution; and depositing a copper layer overlying said barrier layer wherein said copper layer comes from said disproportionation of said simple Cu(I) ions and wherein said evaporation speeds said depositing of said copper layer in the manufacture of said integrated circuit device.

14. The method according to claim 13 wherein said barrier layer comprises one of the group containing: tantalum, tantalum compounds, titanium, titanium compounds, tungsten and tungsten compounds.

15. The method according to claim 13 wherein said stabilized simple Cu(I) ion solution comprises a mixture of simple Cu(I) ions and one of the group containing: a polar organic solvent, more than one polar organic solvent, a mixture of water and a polar organic solvent, and a mixture of water and more than one polar organic solvent.

16. The method according to claim 13 wherein said polar organic solvent comprises one of the group containing: 1-propanol, 2-propanol, allyl alcohol, acetone, mesityl oxide, acetic anhydride, pyridine, acetonitrile, and nitromethane.

17. The method according to claim 13 wherein said step of depositing said copper layer comprises:

depositing a copper seed layer wherein said copper seed layer comes from said disproportionation of said simple Cu(I) ions; and plating said copper seed layer to complete said depositing of s aid copper layer.

* * * * *